(12) United States Patent
Curro

(10) Patent No.: US 8,324,669 B2
(45) Date of Patent: Dec. 4, 2012

(54) PROCESS FOR MANUFACTURING A MOS DEVICE WITH INTERCELL ION IMPLANT CONFINED TO THE GATE ELECTRODE REGION

(75) Inventor: Giuseppe Curro, Messina (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 13/292,003

(22) Filed: Nov. 8, 2011

(65) Prior Publication Data
US 2012/0139034 A1 Jun. 7, 2012

Related U.S. Application Data

(62) Division of application No. 11/919,570, filed as application No. PCT/EP2006/061664 on Apr. 19, 2006, now Pat. No. 8,158,463.

(30) Foreign Application Priority Data

Apr. 27, 2005 (EP) .................................. 05425260

(51) Int. Cl.
*H01L 29/76* (2006.01)

(52) U.S. Cl. ................. 257/288; 257/E29.027; 438/149

(58) Field of Classification Search .................. 257/288, 257/E29.027; 438/149
See application file for complete search history.

(56) References Cited

U.S. PATENT DOCUMENTS

| 4,199,774 A | 4/1980 | Plummer |
| 4,376,286 A | 3/1983 | Lidov et al. |
| 4,974,059 A | 11/1990 | Kinzer et al. |
| 6,049,104 A | 4/2000 | Hsheih |
| 6,362,036 B1 | 3/2002 | Chiozzi et al. |
| 6,992,353 B1 | 1/2006 | Wu |
| 7,067,363 B2 | 6/2006 | Magri' et al. |
| 2003/0057478 A1 | 3/2003 | Yun et al. |
| 2004/0164346 A1 | 8/2004 | Venkatraman |
| 2005/0139906 A1 | 6/2005 | Magri' et al. |
| 2007/0064362 A1 | 3/2007 | Migliavacca |
| 2008/0211021 A1 | 9/2008 | Battiato et al. |

FOREIGN PATENT DOCUMENTS

| EP | 586835 A1 | 3/1994 |
| EP | 747968 A1 | 12/1996 |
| EP | 1313147 A2 | 5/2003 |
| EP | 1455397 A2 | 9/2004 |

(Continued)

OTHER PUBLICATIONS

European Patent Office, International Search Report, International Application No. PCT/EP2006/061664, Jul. 17, 2006.

(Continued)

*Primary Examiner* — Thanh V Pham
(74) *Attorney, Agent, or Firm* — Graybeal Jackson LLP

(57) ABSTRACT

A process for manufacturing a MOS device includes forming a semiconductor layer having a first type of conductivity; forming an insulated gate structure having an electrode region, above the semiconductor layer; forming body regions having a second type of conductivity, within the semiconductor layer, laterally and partially underneath the insulated gate structure; forming source regions having the first type of conductivity, within the body regions; and forming a first enrichment region, in a surface portion of the semiconductor layer underneath the insulated gate structure. The first enrichment region has the first type of conductivity and is set at a distance from the body regions. In order to form the first enrichment region, a first enrichment window is defined within the insulated gate structure, and first dopant species of the first type of conductivity are introduced through the first enrichment window and in a way self-aligned thereto.

23 Claims, 6 Drawing Sheets

FOREIGN PATENT DOCUMENTS

| | | | |
|---|---|---|---|
| JP | 05299658 | A | 11/1993 |
| JP | 07221296 | A1 | 8/1995 |
| JP | 09102506 | A | 4/1997 |
| JP | 10335643 | A | 12/1998 |

OTHER PUBLICATIONS

European Patent Office, European Search Report, EP 05425260, Feb. 20, 2006.

Japanese Patent Office, Patent Abstracts of Japan, JP Publication No. 07-221296, vol. 1995, No. 11, Dec. 26, 1995.

Japanese Patent Office, Patent Abstracts of Japan, JP Publication No. 05-299658, vol. 018, No. 095 (E-1509), Feb. 16, 1994.

Japanese Patent Office, Patent Abstracts of Japan, JP Publication No. 10-335643, vol. 1999, No. 03, Mar. 31, 1999.

Japanese Patent Office, Patent Abstracts of Japan, JP Publication No. 09-102506, vol. 1997, No. 08, Aug. 29, 1997.

PROCESS FOR MANUFACTURING A MOS DEVICE WITH INTERCELL ION IMPLANT CONFINED TO THE GATE ELECTRODE REGION

PRIORITY CLAIM

The present application is a Divisional application of U.S. application Ser. No. 11/919,570 now U.S. Pat. No. 8,158,463, filed Dec. 15, 2008, which was filed pursuant to 35 USC §371 of International Patent Application No. PCT/EP2006/061664, published in English, filed Apr. 19, 2006; which application claims the benefit of European Patent Application No. 05425260.6, filed Apr. 27, 2005; all of the foregoing applications are incorporated herein by reference in their entireties.

TECHNICAL FIELD

Embodiments of the present disclosure relate to processes and methods for manufacturing MOS devices with intercell ion implants, in particular a VDMOS (Vertical Double-Diffused Metal Oxide Semiconductor) power device, to which the following description will make explicit reference without this implying any loss of generality.

BACKGROUND ART

As is known, and as is illustrated in FIG. 1, a VDMOS device 1 comprises a substrate 2 of a heavily doped semiconductor material (for example, of an $N^+$ type), and an epitaxial layer 3, which is also made of semiconductor material with the same type of conductivity as the substrate 2, and overlies the substrate 2. Within a surface portion of the epitaxial layer 3, cells 5 of the VDMOS device 1 are formed, each comprising a body well 6 having a conductivity opposite to that of the epitaxial layer 3 (in the given example, of a P type), and a source region 8, within the body well 6, having the same type of conductivity as the substrate 2 (in the example, of an $N^+$ type). The portion of the epitaxial layer 3 set between adjacent body wells 6 is commonly referred to as "intercell region" or "drift region". The VDMOS device 1 further comprises: an insulated gate structure 9, made by a first region of dielectric material 10 formed above the drift region and partially overlying the body wells 6 and the source regions 8; a gate electrode 11, formed over the first region of dielectric material 10; and a second region of dielectric material 12, overlying the gate electrode 11. A body/source metallization 14 is formed above the body wells 6 for contacting the body wells 6 and the source regions 8, and a drain metallization 15 contacts the substrate 2 from the back.

The substrate 2 has the function of drain for the VDMOS device 1, and the epitaxial layer 3 represents a surface extension thereof. The channel of each cell 5 is constituted by the portion of the corresponding body well 6 arranged directly underneath the insulated gate structure 9, and is delimited by the junction between the source region 8 and the body well 6 on the one hand, and by the junction between the body well 6 and the drift region, on the other hand. The gate electrode 11 is capacitively coupled to the channel for modulating the type of conductivity thereof. In particular, via the application of an appropriate voltage to the gate electrode 11, it is possible to cause the inversion of the channel and thus create a conductive path for majority charge carriers between the source region 8 and the substrate 2, through the channel, and the drift region. The resulting current flow (designated by l in FIG. 1) is affected by the resistance of the channel and drift regions.

As is known, the reduction in the planar and vertical dimensions of VDMOS devices, necessary for the purpose of increasing the packaging density in low-consumption power technologies, leads to a series of problems that limit the performance of VDMOS devices. In particular, a reduction leads to an increase in the sensitivity of VDMOS devices to the surface electrical field in the proximity of the active drain and/or body junctions, and an increase in the contribution of the surface portion of the drift region (commonly known as J-FET contribution) to the ON-resistance $R_{dson}$ of the VDMOS devices. In this regard, if on the one hand the reduction in the lateral separation between contiguous cells 5 enables the increase in the conductive channel perimeter per unit of active area, on the other hand it causes a greater narrowing in the path of the current l, and an increase in the ON-resistance $R_{dson}$. This increase is of particular importance in the case of VDMOS devices of low voltage (less than 100 V), and high packaging density. In order to limit this problem, without however renouncing high packaging densities, it has been proposed to increase the conductivity of the drift region and, in particular, to physically increase the number of majority carriers in the drift region, through a surface-enrichment ion implant between contiguous cells 5.

In detail, according to a known art, the enrichment ion implantation is provided with photolithographic techniques prior to defining the insulated gate structure 9. An appropriate masking is defined, which will delineate the area of the enrichment implant in such a way as not to involve the channel of the VDMOS device, and an ion implantation of an appropriate dopant species is subsequently performed through said masking.

A solution of this type has, however, some drawbacks. In particular, as the intercell separation decreases, on account of the limits of photolithographic definition, the alignment between the enrichment ion implant and the channel becomes increasingly critical. In particular, the possible misalignments of the implant with respect to the body and source active junctions, can lead, for scaled planar geometries, to a non-uniformity of the threshold voltage of the VDMOS devices. In addition, the dielectric of the first region of dielectric material 10, when grown above the enrichment region, shows an increase in the intrinsic defectiveness, and so has a greater criticality in terms of reliability.

According to a different known solution, the enrichment ion implantation is provided in an initial step of the process for manufacturing the VDMOS device, prior to formation of the insulated gate structure 9. In particular, a uniform surface ion implantation (of a blanket type) is made directly in the epitaxial layer 3, without the use of purposely provided masks. However, also said solution is not free from problems, amongst which the degradation in the quality of the dielectric of the first region of dielectric material 10, when this is grown above the enrichment region.

SUMMARY

According to one embodiment of the present disclosure, a process for manufacturing a MOS device with intercell ion implant, and the corresponding MOS device manufactured thereby, enable the problems and disadvantages referred to above to be overcome.

BRIEF DESCRIPTION OF THE DRAWINGS

For a better understanding of the present disclosure, there are now described preferred embodiments thereof, purely by way of non-limiting example and with reference to the attached drawings, wherein.

DETAILED DESCRIPTION

Figure 1:
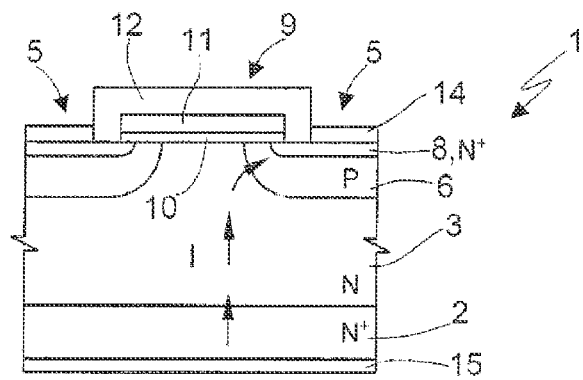
FIG. 1 shows a cross section of a VDMOS device of a known type.
Figure 2:
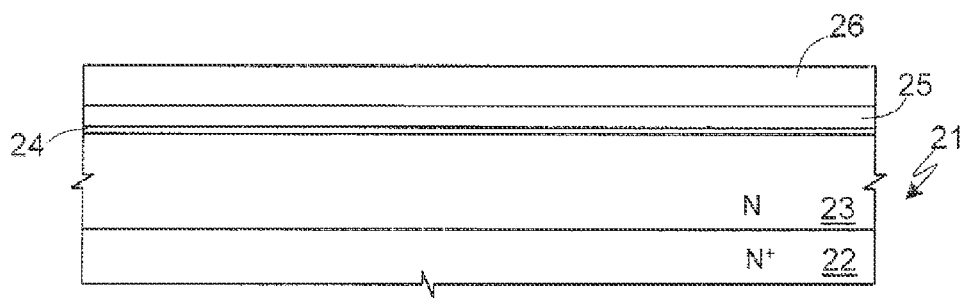
FIG. 2 shows a cross section through a wafer of semiconductor material in an initial step of a process for manufacturing a MOS device.

In detail, with reference to FIG. 2 (which, like the subsequent FIGS., is not drawn to scale), the process for manufacturing a VDMOS power device first envisages provision of a wafer 21 of semiconductor material, preferably silicon, comprising a substrate 22 (illustrated only in FIG. 2), heavily doped and having a first type of conductivity (for example, of an $N^+$ type). Then, a semiconductor layer 23, having the same type of conductivity (in the example, of an N type) as the substrate 22, is formed, for example via an epitaxial growth, above the substrate 22. In a per se known manner which is not described in detail, edge termination structures (not shown) of the VDMOS device are formed, and consequently an active area is defined wherein elementary functional units of the VDMOS device will be provided.

Then, a thin gate dielectric layer 24, having for example a thickness less than 100 nm, is formed on the semiconductor layer 23. The gate dielectric layer 24 can be formed via a thermal oxidation, or else via deposition of an oxynitride layer or of a multilayer constituted by successive layers of oxide, nitride, and oxide laid on top of one another. A gate-electrode layer 25, of polysilicon (intrinsic, or possibly doped), is deposited on the gate dielectric layer 24. Alternatively, a double layer formed by polysilicon and metallic silicide can be deposited. On the gate-electrode layer 25, a layer of insulating material 26 is then deposited, via CVD (Chemical Vapor Deposition). The layer of insulating material 26 can for example be of TEOS (Tetra-Ethyl-Ortho-Silicate), USG (Undoped Silicon Glass), or PSG (Phosphosilicate Glass).

Figure 3:
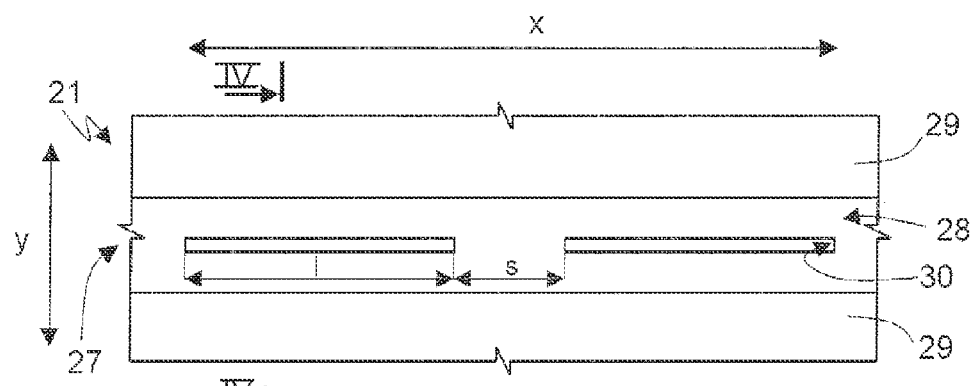
FIG. 3 is a top plan view of a portion of the wafer of FIG. 2 in a subsequent step of the manufacturing process according to a first embodiment of the present disclosure.
Figure 4:
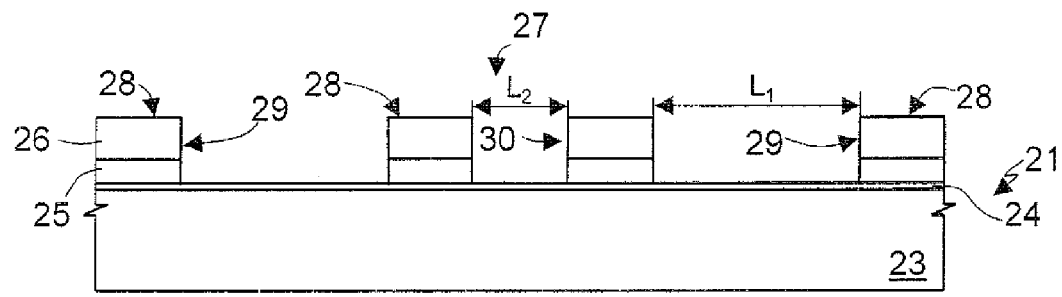
FIG. 4 is a cross-sectional view of the wafer of semiconductor material taken along the line IV-IV of FIG. 3.

Next (see FIGS. 3 and 4), an insulated gate structure 27 is defined using a photolithographic technique on the semiconductor layer 23. In detail, through an appropriate masking, a one-directional etching of the layer of insulating material 26 is first performed with end-point on the gate-electrode layer 25, and then a one-directional etching of the gate-electrode layer 25 is performed for a pre-set time, or else with end-point on the gate dielectric layer 24. The resulting insulated gate structure 27 comprises a plurality of gate portions 28, which have a stripe-like shape and extend parallel to one another in a first direction x. The gate portions 28 are constituted by the superposition of portions of the gate dielectric layer 24, of the gate-electrode layer 25 (in the following said portions will be referred to as gate electrodes 25), and of the layer of insulating material 26, and are separated by body/source windows 29 in a second direction y, orthogonal to the first direction x. The body/source windows 29 have a minor dimension $L_1$ (in the following width $L_1$) in the second direction y. The insulated gate structure 27 further comprises connection elements (not shown) coupling the gate portions 28 in a comblike structure, of a type known for power devices.

According to an embodiment of the present disclosure, simultaneously with the definition of the insulated gate structure 27, enrichment windows 30 are opened within the gate portions 28, enabling access to portions of the semiconductor layer 23 which are designed (as described in detail hereinafter) for the formation of intercell enrichment ion implants between adjacent elementary functional units of the VDMOS device. In particular, within each gate portion 28, a plurality of enrichment windows 30 is opened, the windows being aligned to one another in the first direction x, in a central position with respect to the respective gate portion 28. The enrichment windows 30 have an approximately rectangular shape, with a major dimension l (in the following, length l) in the first direction x, and a minor dimension $L_2$ (in the following, width $L_2$) in the second direction y. The width $L_2$ of the enrichment windows 30 is smaller than the width $L_1$ of the body/source windows 29. In particular, the ratio $L_1/L_2$ can be greater than or equal to 2.

In addition, the enrichment windows 30 are separated from one another by a separation gap s, in the first direction x. In particular, the ratio between the length l of the enrichment windows 30 and the separation gap s should be appropriately sized, taking into account the design and performance requirements of the VDMOS device, and in particular the switching speed, which depends upon the resistance of the insulated gate structure 27 and upon the distributed capacitance between the insulated gate structure 27 and the electrodes of the VDMOS device (source, body and drain). In fact, the interruption of the gate-electrode layer 25 affects both the resistance of the gate electrode and the distribution of the gate electric field in the proximity of the enrichment windows 30.

Figure 5:
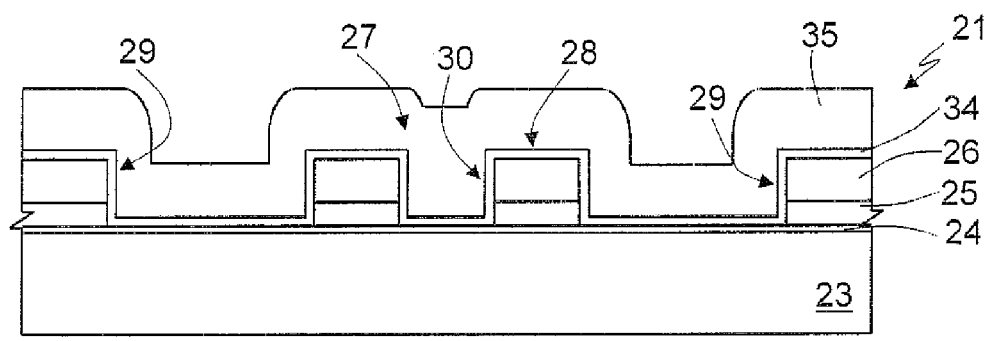
FIGS. 5-12 are cross-sectional views similar to that of FIG. 4 in successive steps of the manufacturing process according to one embodiment of the disclosure.

The manufacturing process proceeds (see FIG. 5) with the deposition of a thin silicon-nitride layer 34, having, for example, a thickness smaller than 50 nm, and a high degree of conformality. On top of the silicon-nitride layer 34 a layer of sacrificial material 35 is then deposited, constituted by polysilicon, either intrinsic or doped. In particular, the thickness of the layer of sacrificial material 35 is greater than the half-width of the enrichment windows 30 (i.e., greater than $L_2/2$).

Figure 6:
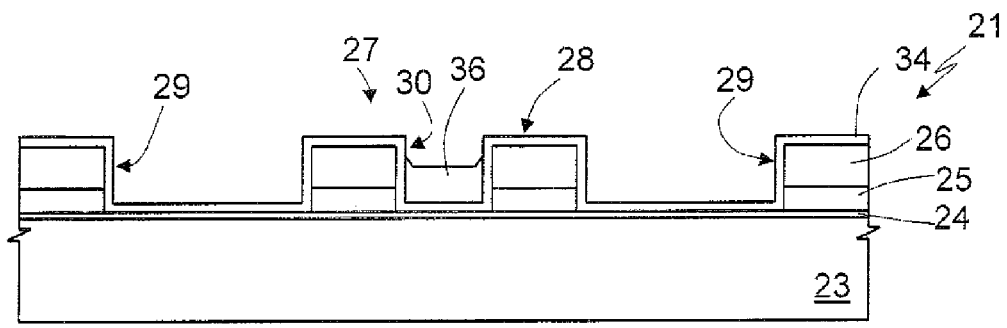

Next (FIG. 6), a wet etching of the layer of sacrificial material 35 is performed, until the silicon-nitride layer 34 within the body/source windows 29 is exposed. At the end of the etching, each enrichment window 30 remains filled by a first barrier region 36, constituted by a remaining portion of the layer of sacrificial material 35. In particular, the maximum value of the width $L_2$ of the enrichment windows 30 should be such as to enable a filling by the first barrier region 36 to be obtained during the aforesaid etching step. The maximum value of the width $L_2$ is, for example, in the region of 1 µm. The minimum value of the width $L_2$ is instead determined by the technological limits of the photo-exposure technique used for the formation of the enrichment windows 30; for example, the minimum value may currently be 0.25 µm.

Figure 7:
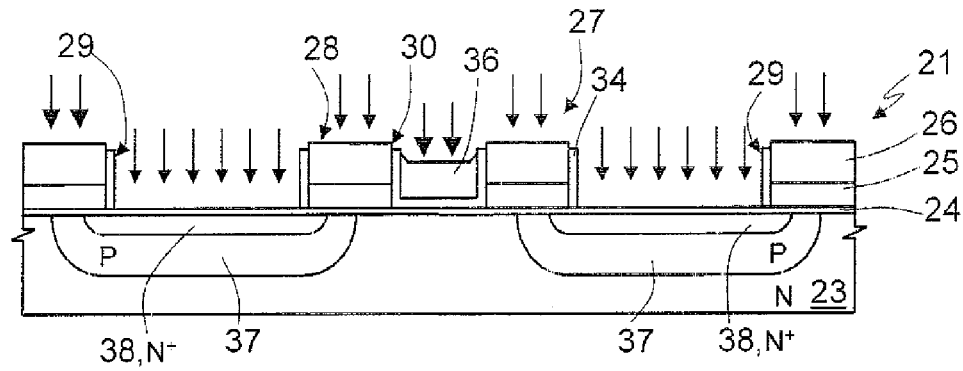

Subsequently (FIG. 7), a one-directional (dry) etching of the silicon-nitride layer 34 is performed, for a pre-set time or else with end-point on the gate dielectric layer 24, and possibly a further one-directional etching of the gate dielectric layer 24. A first ion implantation is then performed, self-aligned with respect to the body/source windows 29, to obtain body wells 37 within the semiconductor layer 23. After a thermal diffusion process of the body wells 37, a second ion implantation is performed to obtain source regions 38 within the body wells 37. In particular, the first ion implantation has a type of conductivity opposite to that of the semiconductor layer 23 (in the example, of a P type), whilst the second ion implantation has a type of conductivity opposite to that of the first ion implantation (in the example, of an N+ type). It should be noted, in particular, that the first and second ion implants are blocked within the enrichment windows 30 by the first barrier region 36.

Figure 8:
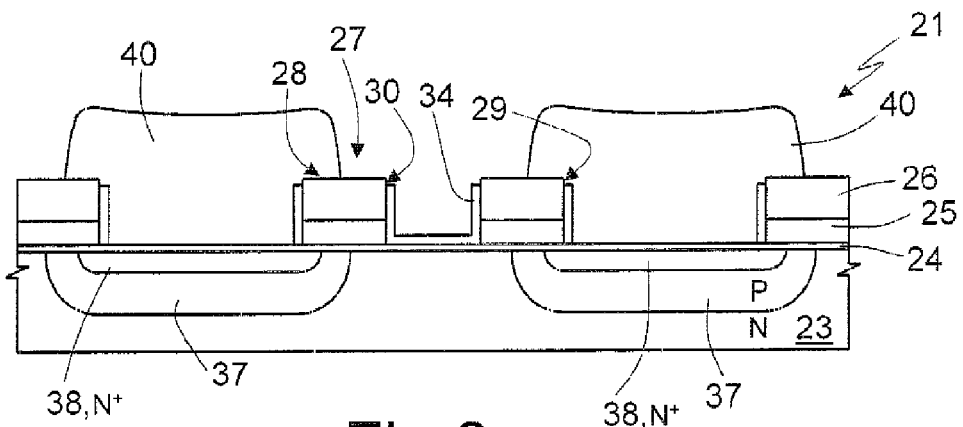

Then (FIG. 8), a photoresist layer is deposited and etched to form a mask 40, which entirely covers the body/source windows 29 and leaves, instead, exposed the enrichment windows 30. A wet etching of the first barrier regions 36 (possibly preceded by a slight etching of the first dielectric layer 26), and a dry etching of the underlying silicon-nitride layer 34, and optionally of the gate dielectric layer 24, are then performed. The mask 40 protects the body/source windows 29 from the aforesaid etching.

Figure 9:
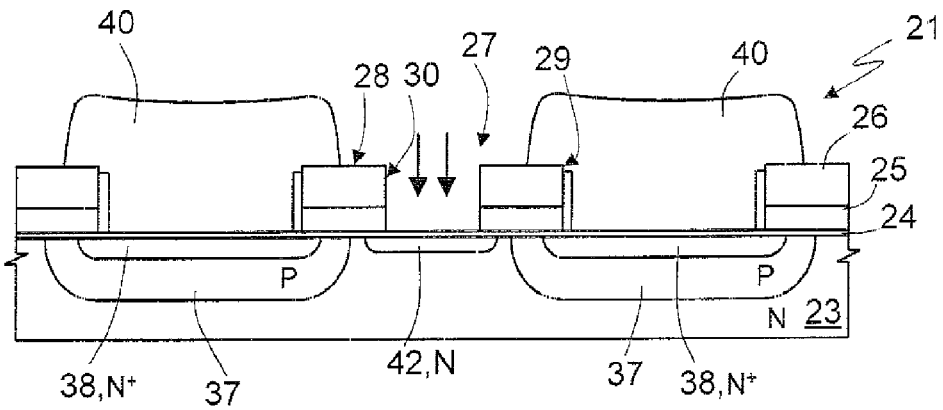

The subsequent process step (see FIG. 9) envisages a self-aligned ion implantation through the enrichment windows 30, following upon which enrichment regions 42 are formed having the same type of conductivity as the semiconductor layer 23 (in the example, of an N type). In particular, the enrichment regions 42 have the function of increasing the conductivity of the regions of the semiconductor layer 23 arranged between adjacent body wells 37 (drift regions) in order to reduce the ON-resistance $R_{dson}$ of the VDMOS device. In this step, the mask 40 protects the body/source windows 29 from the ion implantation. The mask 40 is then removed, and a diffusion of the enrichment region 42 is performed via an appropriate thermal process.

Figure 10:
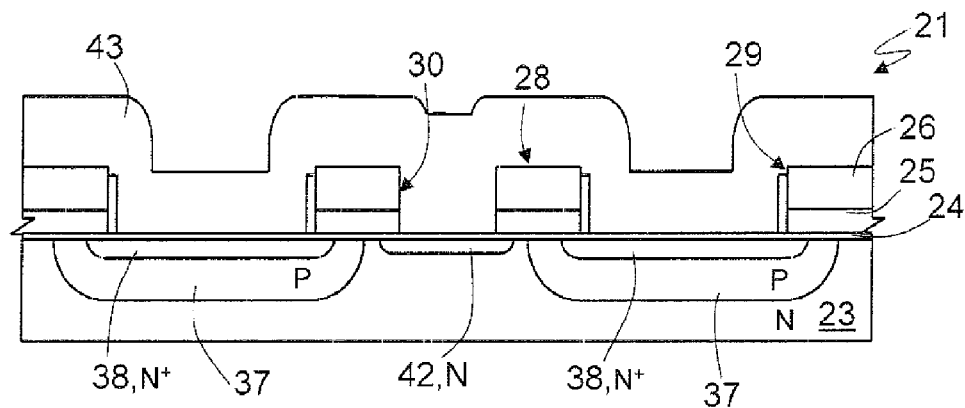

Next (see FIG. 10) a CVD deposition of a filler layer 43 is performed, the filler layer 43 being of a dielectric material with low conformality, the thickness of which depending upon the planar geometry of the VDMOS device; the dielectric material can be USG, PSG, TEOS, or any other dielectric or dielectric multilayer.

Figure 11:
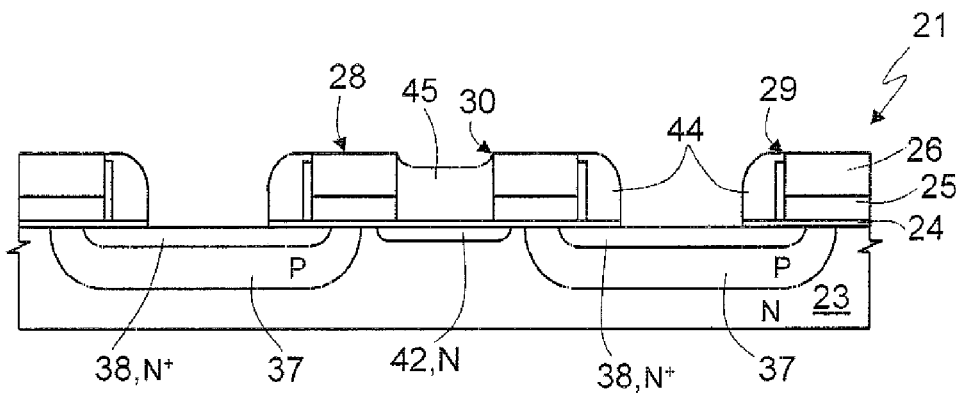

After a densification step of the filler layer 43, a one-directional etching thereof is performed (FIG. 11), with end-point on the semiconductor layer 23. Following the etching, two insulation spacers 44 at the edges of each body/source window 29 are formed, in a position adjacent to the respective gate portions 28. The enrichment windows 30 remain filled with an insulation region 45, constituted by a remaining portion of the filler layer 43.

Figure 12:
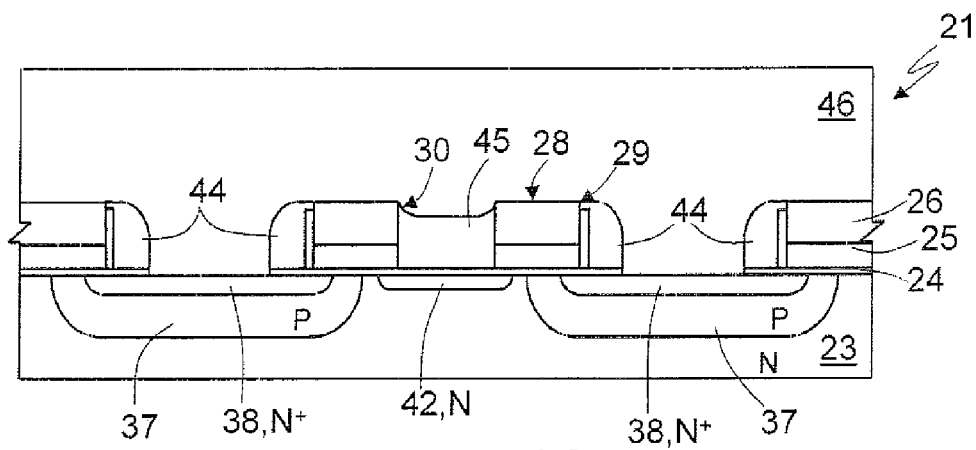

Next (see FIG. 12), a layer of metallic material 46 is formed on the wafer 21, having the function of contacting the source regions 38. Interruptions (not shown) of the source regions 38 are provided in the first direction x, in such a way that the layer of metallic material 46 contacts also the body wells 37. The insulation spacers 44 electrically insulate from one another the layer of metallic material 46 and the gate electrodes 25. The ratio between the thickness of the filler layer 43 and the width $L_1$ of the source/body windows 29 is to be sized (generally maximized) so as to obtain a robust and homogeneous lateral insulation of the gate electrodes 25. For example, the value of the ratio may be comprised between 0.1 and 0.2.

The manufacturing process of the VDMOS device terminates with the preparation and metallization of the back of the wafer 21 to provide a drain electrical contact.

Figure 13:
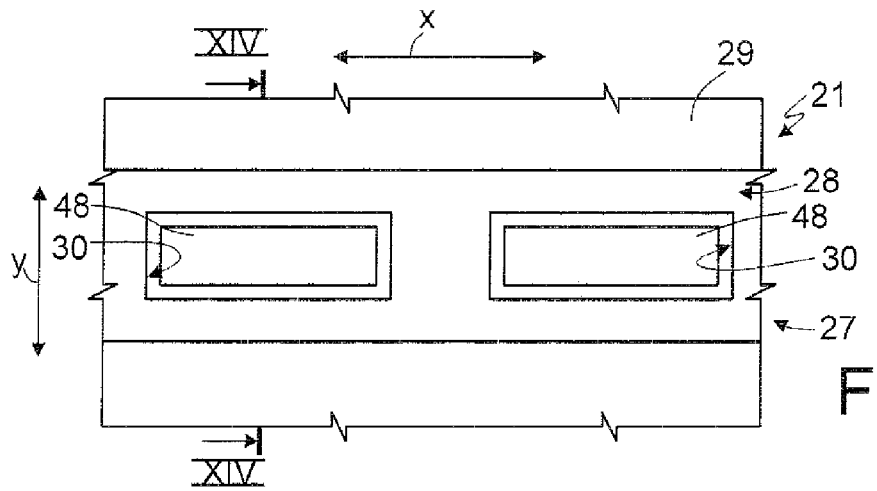
FIG. 13 is a top plan view similar to that of FIG. 3, corresponding to a process for manufacturing a MOS device according to a different embodiment of the present disclosure.
Figure 14:
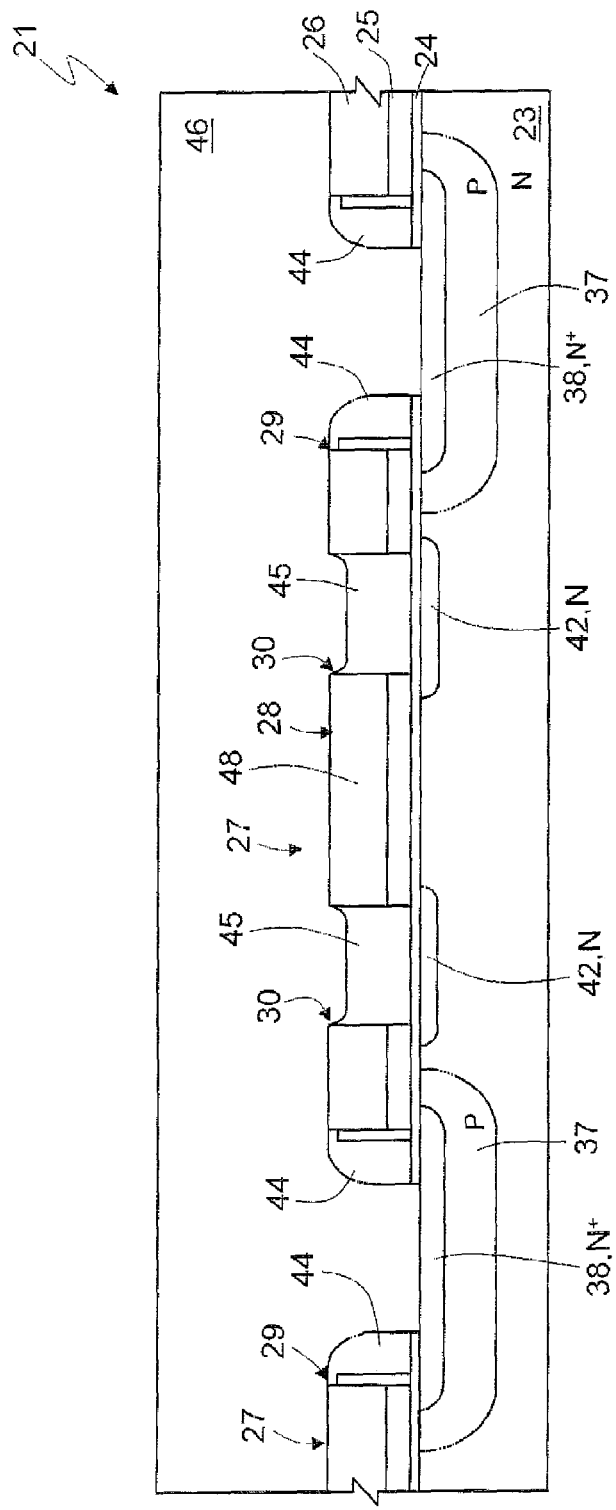
FIG. 14 is a cross-sectional view of the wafer of semiconductor material taken along the line XIV-XIV of FIG. 13, in a final step of the manufacturing process of the MOS device according to an embodiment of the present disclosure.

According to a different embodiment of the present disclosure, illustrated in FIGS. 13 and 14, the enrichment windows 30 (and consequently the enrichment regions 42) have a different shape, in particular the shape of a rectangular annulus. This embodiment is advantageous in VDMOS devices in which the distance between adjacent body wells 37 should be kept wide to reduce the J-FET contribution in the ON-resistance $R_{dson}$. In fact, using the first embodiment described, the enrichment regions 42, provided for reasons of symmetry in the proximity of the center of the gate portions 28, would be too distant from the terminations of the conduction channel of the VDMOS device to cause a significant reduction in the ON-resistance $R_{dson}$. Instead, in the case of enrichment windows 30 having the shape of a rectangular annulus, the width of the windows is still compatible with the need for self-alignment of the enrichment regions 42, and at the same time the distance between the enrichment regions 42 and the channel terminations is sufficiently small as to guarantee a considerable reduction in the ON-resistance $R_{dson}$. The definition of the enrichment windows 30, in this case brings about the formation of islands 48, which are physically separated from the gate electrode 25 and so cannot be directly biased. This leads to a reduction in the capacitance between the gate electrode 25 and the drain and in the charging time of the gate electrode 25. At the same time, there is no excessive alteration in the property of "field plating", which normally the gate electrode 25 exerts on the distribution of the drain electric field in the active region of the VDMOS device.

Figure 15:
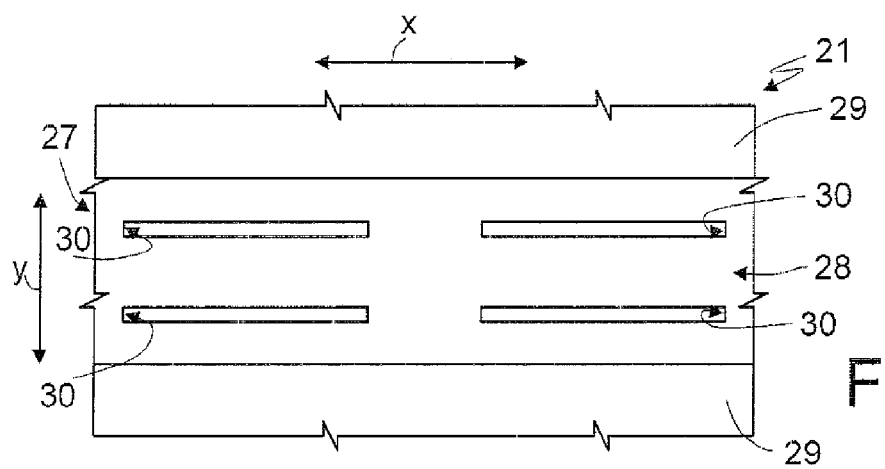
FIGS. 15 and 16 are top plan views similar to that of FIG. 3, corresponding to further embodiments of the present disclosure.

According to a further embodiment of the present disclosure, illustrated in FIG. 15, a plurality of pairs of enrichment windows 30, aligned in the first direction x, is defined within each gate portion 28. The enrichment windows 30 of each pair are rectangular, parallel to one another and to the first direction x and aligned in the second direction y. In addition, the enrichment windows 30 are provided in the proximity of the channel regions of the VDMOS device. In particular, the enrichment windows 30 are arranged symmetrically with respect to a central axis of the respective gate portion 28 extending in the first direction x.

Figure 16:
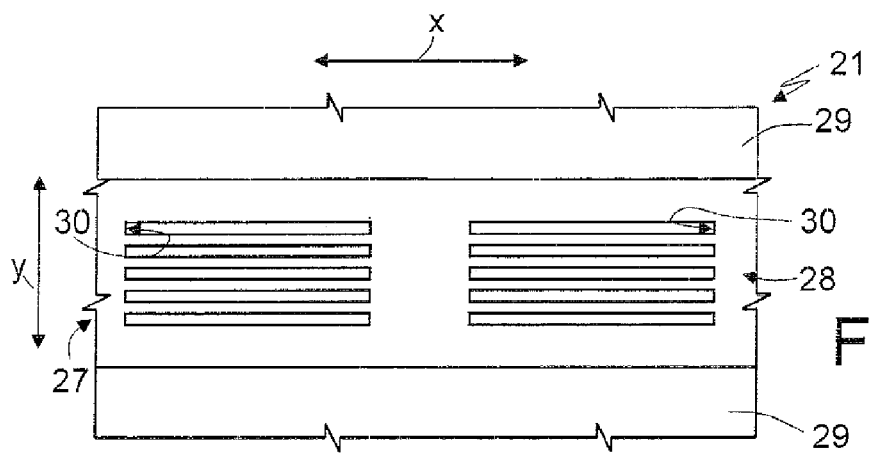

A further embodiment, illustrated in FIG. 16, envisages the formation, within each gate portion 28, of a plurality of grids of enrichment windows 30 aligned in the first direction x. The enrichment windows 30 within each grid are rectangular and parallel to one another and to the first direction x, and are aligned in the second direction y and arranged symmetrically with respect to a central axis of the respective gate portion 28, extending in the first direction x. This embodiment leads to an increase in the planar resistance of the gate electrode 25, but to a decrease in the ON-resistance $R_{dson}$, due to the presence of a number of enrichment regions 42.

The advantages of the described manufacturing process are clear from the foregoing description.

In particular, thanks to the self-aligned ion implantations through the enrichment windows, the alignment of the inter-cell enrichment regions with respect to the body and source diffusions is automatic and guaranteed, without the need for definition of purposely provided masks. In this way, the process for manufacturing the VDMOS device may be freed from the technological limits of the photolithographic processes, above all as regards highly scaled technologies.

The enrichment regions enable a marked reduction in the ON-resistance of the VDMOS device, and at the same time characteristics such as planar resistance and gate capacitance are not significantly altered, without any consequent modification in the switching speed of the VDMOS device.

Finally, it is clear that modifications and variations may be made to what is described and illustrated herein, without thereby departing from the scope of the present disclosure, as defined in the attached claims.

In particular, the gate and source/body electrical contacts can be defined with photolithographic technique, i.e., without self-aligned formation of the insulation spacers in the body/source windows. In this case, the second layer of dielectric material does not necessarily have a low conformality, and should have a thickness greater than the half-width of the enrichment window. The corresponding process steps envisage deposition of the second layer of dielectric material, densification thereof, and then photolithography of the contacts, in a way in itself known and hence not described in detail herein.

In addition, the shape and the number of the enrichment windows could be different from what has been described and illustrated.

In addition, it is clear that the described process may be advantageously applied to other MOS devices, such as for example signal VDMOSs, IGBTs, MOSFETs, whether N-channel or P-channel, with edge terminations of any shape and size, and any configuration of the cells in the active area (for example, hexagonal or square). In addition, even though the entire description has been made with reference to the case of a P-channel VDMOS device, extension to the dual case corresponding to an N-channel VDMOS device is immediate. These MOS devices may be contained in a variety of different types of electronic systems, such as power system, control systems, and computer systems.

Finally, the described processes can advantageously be applied for forming any kind of ion implant in the intercell region.

From the foregoing it will be appreciated that, although specific embodiments of the disclosure have been described herein for purposes of illustration, various modifications may be made without deviating from the spirit and scope of the disclosure.

The invention claimed is:

1. A MOS device, comprising:
a semiconductor layer having a first type of conductivity;
an insulated gate structure formed above said semiconductor layer, and comprising a first region of dielectric material and an electrode region;
body regions having a second type of conductivity, formed within said semiconductor layer, laterally and partially underneath said insulated gate structure;
source regions having said first type of conductivity, formed within said body regions; and
a first enrichment region formed in a surface portion of said semiconductor layer arranged underneath said insulated gate structure, said first enrichment region having said first type of conductivity and being set at a distance from said body regions,
wherein said electrode region has at least a first opening confined to the electrode region overlying said first enrichment region and filled at least partially with dielectric material.

2. The device according to claim 1, wherein said insulated gate structure comprises at least two gate portions separated by a body/source window in a transverse direction, said first opening and said body/source window having a respective dimension in said transverse direction; the ratio between the respective dimensions of said body/source window and of said first opening being not less than two.

3. The device according to claim 2, wherein said first opening is formed in a first of said two gate portions, and said first gate portion further has at least one second opening filled at least partially with dielectric material and overlying a second enrichment region formed in said semiconductor layer said first and said second openings having an approximately rectangular shape.

4. The device according to claim 3, wherein said first and second openings are aligned to one another in at least one direction of alignment chosen between said transverse direction and a direction perpendicular to said transverse direction.

5. The device according to claim 3, wherein said first and second openings have approximately the shape of a rectangular annulus, and are filled completely with dielectric material; each one of said first and second openings surrounding a respective island of conductive material.

6. A device, comprising:
a semiconductor layer;
an insulated gate structure formed above the semiconductor layer and having at least a first opening surrounded by the insulated gate structure;
a body region formed within the semiconductor layer;
a source region formed within the body region; and
an enrichment region formed in a surface portion of the semiconductor layer underneath the insulated gate structure such that the at least first opening is aligned with the enrichment region.

7. The device of claim 6, wherein the at least first opening is filled with a dielectric material.

8. The device of claim 6, wherein the semiconductor layer comprises a conductivity of a first type.

9. The device of claim 6, wherein the body region comprises a conductivity of a second type.

10. The device of claim 6, wherein the source region comprises a conductivity of a first type.

11. The device of claim 6, wherein the gate structure comprises a first region of dielectric material and an electrode region.

12. The device of claim 6, wherein the at least one opening comprises an opening having a rectangular area.

13. The device of claim 6, wherein the source region comprises a first width and the opening comprises a second width that is less than the first width.

14. The device of claim 13, wherein the first width comprises a width at least twice as large as the second width.

15. The device of claim of 6, further comprising at least two openings in the insulated gate structure, each opening having a length larger than a width and each opening being aligned in a direction corresponding to the length of each opening and each opening separated by a distance.

16. The device of claim 15, wherein the distance between each opening comprises a dimension suited for a design speed of the device.

17. The device of claim 6, wherein the at least one opening comprises an opening having a rectangular annulus.

18. The device of claim 6, further comprising at least a second opening, each of first and second opening having a length larger than a width and aligned parallel to each other with respect to the direction of the length of each opening.

19. The device of claim 6, wherein each of the first and second opening are aligned equidistant from a central axis of the insulated gate structure, the central axis corresponding to the direction of the length of the first and second openings.

20. An integrated circuit, comprising:
a semiconductor layer;
an insulated gate structure formed above the semiconductor layer and having at least a first opening surrounded by the insulated gate structure;
a body region formed within the semiconductor layer;
a source region formed within the body region; and
an enrichment region formed in a surface portion of the semiconductor layer underneath the insulated gate structure such that the at least first opening is aligned with the enrichment region.

21. The integrated circuit of claim 20, further comprising a single integrated circuit die.

22. The integrated circuit of claim 20, further comprising multiple integrated circuit dies.

23. A system, comprising:
a MOS device, including:
a semiconductor layer;
an insulated gate structure formed above the semiconductor layer and having at least a first opening surrounded by the insulated gate structure;
a body region formed within the semiconductor layer;
a source region formed within the body region; and
an enrichment region formed in a surface portion of the semiconductor layer underneath the insulated gate structure such that the at least first opening is aligned with the enrichment region.

* * * * *